United States Patent [19]

Chatterjee

[11] Patent Number: 4,554,572
[45] Date of Patent: Nov. 19, 1985

[54] SELF-ALIGNED STACKED CMOS

[75] Inventor: Pallab K. Chatterjee, Richardson, Tex.

[73] Assignee: Texas Instruments Incorporated, Dallas, Tex.

[21] Appl. No.: 505,534

[22] Filed: Jun. 17, 1983

[51] Int. Cl.$^4$ ............................................. H01L 27/02
[52] U.S. Cl. ..................................... 357/42; 357/23.7; 357/59; 357/71; 357/4
[58] Field of Search ..................... 357/23.7, 42, 59, 71, 357/71 S, 71 P, 4

[56] References Cited

U.S. PATENT DOCUMENTS

| | | | |
|---|---|---|---|
| 4,272,880 | 6/1981 | Pashley | 357/23.7 |
| 4,309,224 | 1/1982 | Shibata | 357/23.1 |
| 4,336,550 | 6/1982 | Medwin | 357/23.7 |
| 4,476,475 | 10/1984 | Naem et al. | 357/59 |

FOREIGN PATENT DOCUMENTS 0211779 12/1982 Japan ....................................... 357/22

Primary Examiner—Andrew J. James
Assistant Examiner—Lamarr A. Brown
Attorney, Agent, or Firm—Robert Groover, III; Douglas A. Sorensen; Melvin Sharp

[57] ABSTRACT

A CMOS device configuration in which a complete CMOS inverter is contained in the space normally required for a single NMOS transistor of equivalent geometry. A first polysilicon layer of normal thickness and N+ doping is used for the N channel gate, and a second polysilicon layer is deposited conformally over the oxide which encapsulates the first polysilicon layer. The second polysilicon layer is thin and doped p-type. The second layer is only lightly doped initially, and is then doped more heavily by a low-energy implantation. The portions of the second poly layer which are adjacent to the sidewalls of the gate level in first poly will be shielded from the heavy implantation, and will therefore provide relatively lightly doped p-type channel regions, to form a pair of PMOS polysilicon transistors addressed by the N+ first poly gate electrode. Preferably the channel doping of these polysilicon transistors is at least $10^{17}$. Silicide strapping is optionally used on the remainder of the second poly level to improve its conductivity.

20 Claims, 5 Drawing Figures

SELF-ALIGNED STACKED CMOS

BACKGROUND AND SUMMARY OF THE INVENTION

The present invention relates to integrated circuits containing both N-channel and P-channel insulated gate field effect transistors (CMOS integrated circuits).

The merits of CMOS technology have been well established. It has also been shown that a vertical structure which stacks the P-channel transistor on top of the N-channel transistor is extremely area efficient and is attractive for high-density memory and logic circuits. However, the major disadvantage of all stacked CMOS structures which have been investigated so far is that the P-channel top device is not self aligned to the N-channel underlying device.

That is, a great advantage of conventional technology is that the source and drain implants are screened by the gate, so that, after the source/drain implants have been driven in, the gate is automatically self aligned to the lightly doped (p-type) space between the source and drain regions, which defines the channel regions of the device.

However, in a structure where a single gate electrode is used to address both an N-channel device in the silicon substrate and a polysilicon P-channel device, no such way to automatically align the location of the channel region of the P-type device to the common gate level has been found in the art. Misalignment can result in tremendously increased series resistance for the polysilicon device. This is particularly unfortunate since the series resistance of polysilicon devices in the prior art is already extremely high. Moreover, misalignment can also result in an excessively short effective channel region, so that the device exhibits poor subthreshold behaviour (soft turn off). Again, soft turn off is already a difficulty of the prior art polysilicon transistor, and it is very important not to exacerbate this inherent source of possible difficulties.

Thus, it is an object of the present invention to provide a stacked CMOS device structure, wherein a common gate level is self aligned both to MOS transistor having a channel region in a monocrystalline substrate and also to a separate transistor having a polycrystalline channel region.

It is a further object of the present invention to provide a device wherein a common gate electrode is self-aligned both to an N-channel transistor and also to at least one P-channel transistor.

It is the further object of the present invention to provide a stacked CMOS structure wherein good turn-off characteristics are exhibited by both N-channel and P-channel devices.

It is a further object of the present invention to provide a stacked CMOS structure wherein good turn-off characteristics are exhibited by the polysilicon transistor.

It is a further object of the present invention to provide a stacked CMOS device structure wherein acceptably low series resistance is provided in the polysilicon transistor.

To achieve these and other objects, the present invention provides a CMOS device configuration in which a complete CMOS inverter is contained in the space normally required for a single NMOS transistor of equivalent geometry. A first polysilicon layer of normal thickness and N+ doping is used for the N channel gate, and a second polysilicon layer is deposited conformally over the oxide which encapsulates the first polysilicon layer. The second polysilicon layer is thin and doped p-type. The second layer is only lightly doped initially, and is then doped more heavily by a shallow implantation. Portions of the second polylayer which are adjacent to the sidewalls of the gate electrode will be shielded from the implantation, and will therefore remain relatively lightly doped p-type channel regions, to form a pair of PMOS polysilicon transistors addressed by the N+ first poly gate electrode. Preferably the channel doping of these polysilicon transistors is at least 1017. Silicide strapping is optionally used on the remainder of the second polysilicon level to improve its conductivity.

BRIEF DESCRIPTION OF THE DRAWINGS

The present invention will be described with reference to the accompanying drawings, wherein:

FIG. 3A shows a section of the gate level in first poly, and FIG. 3B shows the same structure after deposition of the thin second polysilicon layer.

DESCRIPTION OF THE PREFERRED EMBODIMENTS

Figure 1:
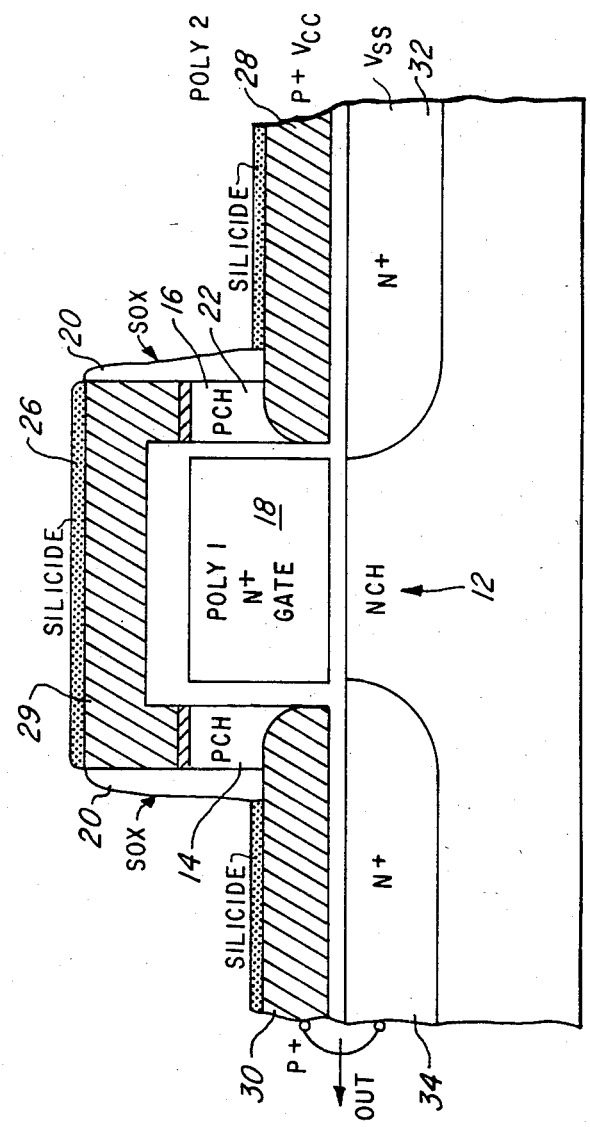
FIG. 1 shows a cross section of an embodiment of the device according to the present invention.

The principal embodiment of the present invention is shown in FIG. 1. An N-channel bulk transistor is combined with two series connected sub micron P-channel polysilicon devices 14 and 16 formed along the sidewalls of the N+ polysilicon gate electrode 18. The P-channel transistors 14 and 16 are formed on the second level of polysilicon, which in this process has to be thinner than the first level of polysilicon. The process sequence follows that of the standard silicon gate technology to form the N-channel transistor 12 in the bulk. The second polysilicon level is patterned and implanted, using a high energy implant to specify the doping of the channel regions 22. A sidewall oxide 20 is then preferably grown and anisotropically etched. This sidewall oxide 20 serves to encapsulate the channel doping regions 22 from any off-axis component of the following P+ implant. A P+ implant is then performed and driven in, to form the sources and drains of the sidewall P-channel transistors 14 and 16. Note that a heavily doped region 29 connects the two channel regions 22 together. Since the channel regions 22 are both reasonably short, the total series resistance of the devices is not excessively large.

In addition, a silicide layer 26 can also be formed, to further reduce series resistance. This is formed by known methods, e.g. by depositing titanium metal, heating the structure to cause the titanium to react with the polysilicon, and etching away unreacted titanium metal. The sidewall oxide regions 20 are additionally useful in this embodiment, to prevent silicide to silicide shorts bridging the channel regions 22.

It should be noted that the structure of FIG. 1 is itself a complete CMOS inverter, with the connections shown. That is, if the P+ region 28 is connected to a first supply voltage and the N+ diffusion 32 is connected to a second supply voltage, and an input signal is applied to the N+ gate 18, a node connecting P+ region 30 to N+ diffusion 34 will provide the output of a CMOS inverter.

Figure 4:
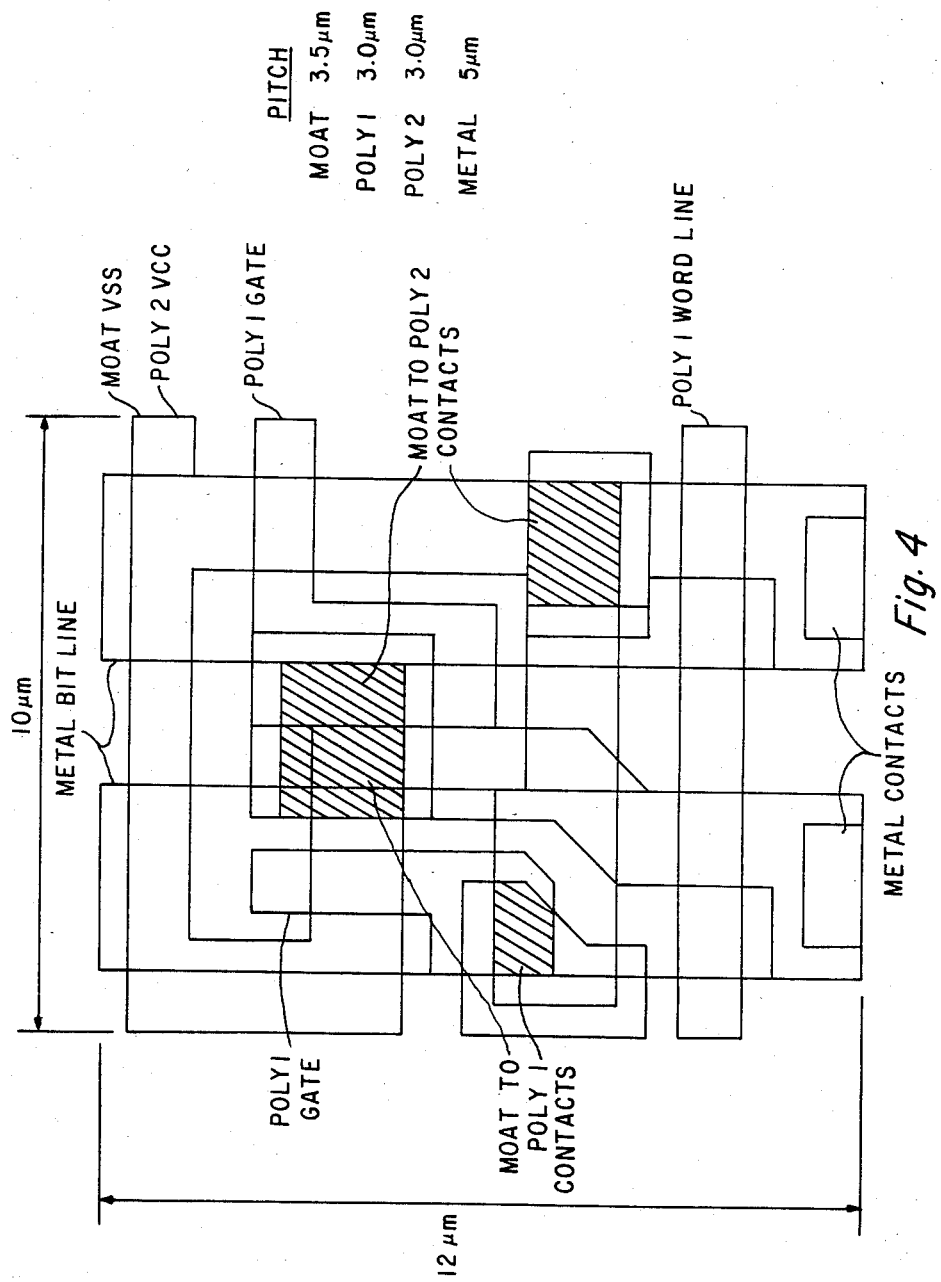
FIG. 4 shows the layout of an SRAM cell according to the present invention.

However, it will be obvious to those skilled in the art, that the present invention teaches a CMOS circuit building block of general applicability, and can be used in a very wide variety of other circuits. For example, the P-channel devices 14 and 16 can be used as load elements in an SRAM cell. Such an SRAM cell is shown in the mask layout of FIG. 4.

Figure 2:
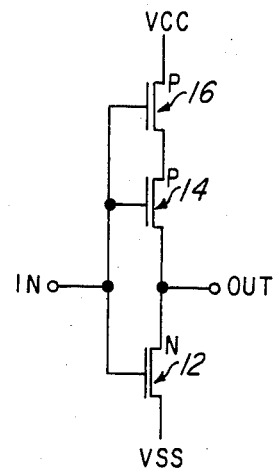
FIG. 2 shows an equivalent circuit of the device shown in FIG. 1.
Figure 3A:
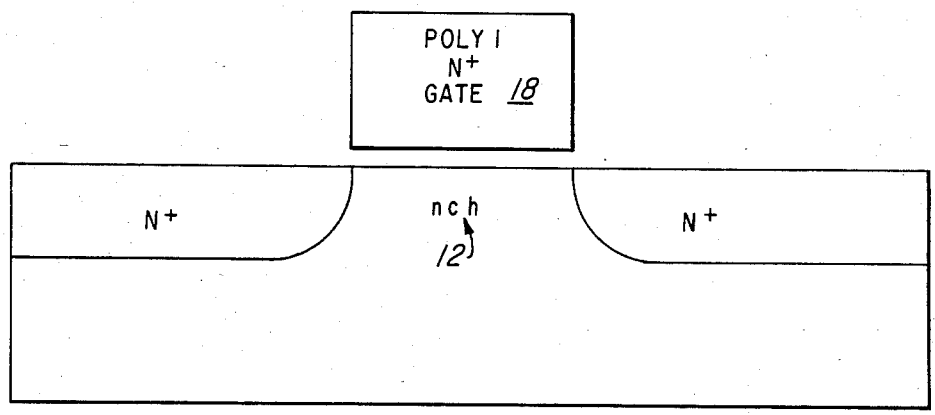
FIGS. 3A and 3B show successive stages in fabrication of the device according to the present invention.
Figure 3B:
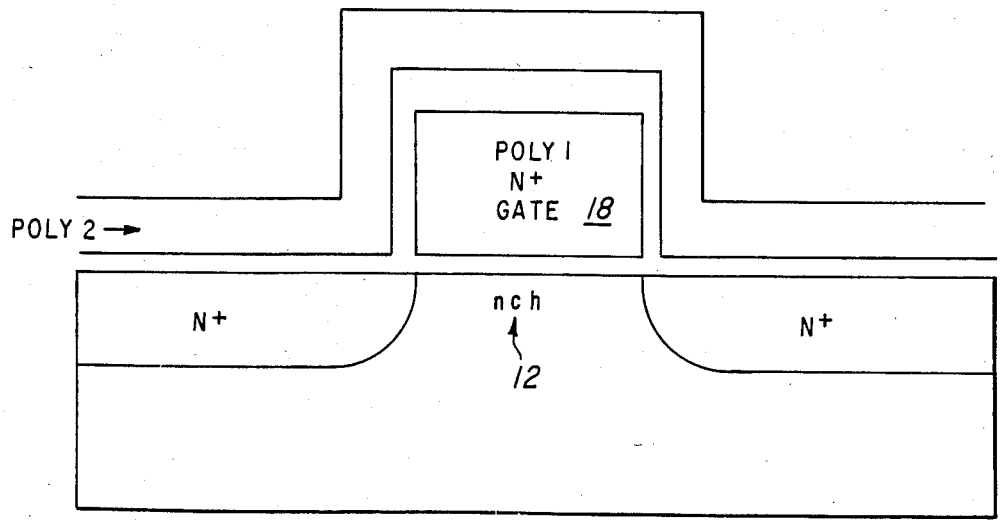

This layout represents an example of an SRAM cell according to the present invention, and is not by any means the sole SRAM embodiment using the present invention. It is included here merely as illustrative. The equivalent circuit diagram of this cell is shown in FIG. 2, and it can be seen that this cell is simply a conventional CMOS SRAM cell, i.e., a cross-coupled CMOS latch, connected through two pass transistors to a pair of complementary bit lines.

The fabrication of the device structure of FIG. 1 will now be described in more detail. This detail is provided as illustrative of the presently contemplated best mode of making and using the invention, and is certainly not a necessary part of the invention.

Processing is completely conventional up through fabrication of the first poly level 18, i.e., through patterning of most field oxide growth, deposition, doping, and patterning of the first poly layer, and implantation to form the N+ regions 32 and 34. Preferably the substrate is (e.g.) P-type 100 material with a resistivity in the neighborhood of 3–6 ohm-cm. Preferably the first poly layer 18 is (e.g.) 6,500 angstroms thick, and is POCl$_3$ doped to achieve a high dopant concentration. The first poly layer is anisotropically etched to achieve essentially vertical sidewalls, i.e., sidewalls essentially normal to the substrate surface thereunder.

The N+ gate structure 18 is then oxidized, in a two step oxidation process. A first oxidation step is performed (e.g.) at 900 degrees C., for 30 minutes in pure oxygen. This oxidation step removes the normal asperities in the as-deposited polysilicon, and the oxide thus formed is merely etched away. The second oxidation step uses 13 minutes and oxygen +5% HCl at 1000 degrees C.

Immediately after this oxidation step 1250 angstroms of polysilicon is deposited in a hotwall furnace, and is briefly annealed in stream at 900 degrees. A BF$_2$ implant is then applied at 100KeV at a dosage of $1 \times 10^{12}$ per cm$^2$. This produces a dopant concentration in the P-channel regions 22 of approximately $10^{17}$ per cm$^3$. The thin polysilicon layer which has been deposited and initially doped is now patterned and etched. Note than an isotropic polysilicon etch is preferably used at this stage, to avoid filamentation of the second poly layer at undesired sidewalls of the first poly layer. The isotropic poly etch is preferably performed using a wet etch or a high-pressure plasma etch.

Next, 1000 angstroms of LPCVD oxide is deposited overall. This oxide layer will provide the sidewall oxide filaments 20. This oxide layer is then annealed for 20 minutes in oxygen, and anisotropically etched to clear the oxide from flat surfaces. This forms the oxide filaments 20. Next, an additional 650 angstroms of LPCVD oxide is preferably deposited, for encapsulation during the implant.

Next, a lower energy high-dose implant is used to form the source and drain region 26, 28, (30) and 29 in the second poly level created. Note that the energy of this implant is so low that the channel regions 22 are not penetrated. In the presently preferred embodiment, this implant comprises boron difluoride at 100 KEV at a dose of $10^{15}$ per cm$^2$. This produces a doping concentration in the exposed poly portions 30, 28, and 29 of approximately $10^{19}$ per cm$^3$.

This implant is then annealed for 30 minutes at 800 degrees C in argon.

At this point, if a silicide layer is to be formed on the P+ polysilicon layers, this optional step should be performed. However, this step is not part of the presently preferred embodiment.

Hydrogenation is now performed. In the presently preferred embodiment, the wafer is annealed in a hydrogen plasma to passivate dangling bonds at grain boundaries. This reduces trap density, and permits the p-channel devices to have better device parameters. In the presently preferred embodiment, a standard parallel-plate plasma reactor is used, with an RF power of 600 watts applied over a susceptor which is approximately 20 inches in diameter. Hydrogen is flowed at 2000 SCCM at a pressure of 1 Torr. Preferably hydrogenation is continued for 60 minutes at 300 degrees C.

This hydrogenation step provides major advantages. Hydrogen passivation means that the polysilicon channel transistors have high mobility and low leakage current.

Subsequent to the hydrogenation step, it is desirable to avoid high-temperature processing steps of extended duration. Any high-temperature step or medium-temperature step which must be continued for a long period of time is likely to cause partial escape of hydrogen from the polysilicon film, and therefore degrade properties of the polysilicon device layer.

The inter level oxide (ML$_o$) is now deposited. And the presently preferred embodiments, an OCD spin-on glass is used to deposit phosphosilicate to about 6500 angstroms thickness, and the slice is then baked at low temperature (e.g. 300 degrees C.) for long enough to drive out the solvent from the OCD glass.

Alternatively, other techniques for low-temperature planarization of an inter level oxide could be used. For example, conventional phosphosilicate glass or borophosphosilicate glass deposition could be used with laser reflow. Alternatively, an organic can be used for low-temperature inter level dielectric. Polyimide or PIQ are examples of organic inter level dielectrics.

Next, the contact pattern is cut, and metal is deposited and patterned. The last process modification occurs at the contact sintering step. In the presently preferred embodiment, the metal used is aluminum with 1% silicon, sputtered to a thickness of 9000 angstroms, and the contact sintering is performed at 400 degrees C. in hydrogen for ten minutes. This contact sintering step is slighlty lower-temperature and/or shorter than normal and, although this precaution against hydrogen escape is not strictly necessary, it is preferable.

As will be appreciated by those skilled in the art, the present invention provides a fundamental new device structure. This device structure is not by any means implmented to the particular geometries set forth nor to the particular processing steps or sequences of processing steps set forth, but may be practiced in an immense variety of modification and variations, in a context of a large variety of integrated circuit layouts. The scope of the present invention is therefore not limited except as set forth in the accompanying claims.

Additional information regarding the properties of the thin polysilicon transistor is found in simultaneously-filed patent application Ser. No. (505156), which is hereby incorporated by reference.

What is claimed is:

1. An integrated circuit structure comprising:
   (a) a substrate transistor formed at the surface of a semiconductor substrate, said substrate transistor having source and drain regions of a first conductivity type and a channel region interposed therebetween;
   (b) an insulated gate electrode above said channel region of said substrate transistor, said insulted gate electrode having sidewalls substantially normal to said surface of said substrate: and
   (c) a thin polysilicon layer extending continuously from atop the source of said substrate transistor, over a first sidewall of said gate electrode, over the top surface of said gate electrode, over a second sidewall of said gate electrode, and over the drain of said substrate transistor;
   (d) said thin polysilicon layer comprising channel portions having a dopant concentration of less than $10^{18}$ and being disposed adjacent to and along the sidewalls of said gate electrode, said channel portions of said thin polysilicon layer being separated from said gate electrode by an insulator thickness of less than 500 angstroms;
   (e) said channel portions of said thin polysilicon layer having doping levels which are less than the dopant concentration of the remainder of said thin polysilicon layer by at least an order of magnitude, said remainder of said thin polysilicon layer being doped with a second conductivity type.

2. The device of claim 1, wherein said polysilicon channel regions comprise a dopant concentration of at least $5 \times 10^{16}$ cm$^3$.

3. The device of claim 1, wherein said polysilicon channel regions further comprise sidewall oxides adjacent thereto.

4. The device of claim 1, further comprising silicide regions overlying the portions of said thin polysilicon layer apart from said channel regions of said thin polysilicon layer.

5. The device of claim 1, wherein said thin polysilicon layer comprises a substantial concentration of hydrogen at the grain boundaries thereof.

6. The device of claim 1, wherein said gate electrode comprises polysilicon doped with said first conductivity type, and wherein said thin polysilicon layer comprises a second conductivity type.

7. The device of claim 1, wherein said channel portions of said thin polysilicon layer have a thickness which is less than 2000 angstroms.

8. The device of claim 1, wherein said channel portions of said thin polysilicon layer have said second conductivity type.

9. The device of claim 2 wherein said polysilicon channel regions further comprise sidewall oxides adjacent thereto.

10. The device of claim 1 wherein said thin polysilicon layer defines two series connected transistors.

11. The device of claim 2 wherein said thin polysilicon layer defines two series connected transistors.

12. The device of claim 3 wherein said thin polysilicon layer defines two series connected transistors.

13. The device of claim 9 wherein said thin polysilicon layer defines two series connected transistors.

14. The device of claim 2 wherein said channel portions of said thin polysilicon layer have said second conductively type.

15. The device of claim 3 wherein said channel portions of said thin polysilicon layer have said second conductivity type.

16. The device of claim 11 wherein said channel portions of said thin polysilicon layer have said second conductivity type.

17. The device of claim 12 wherein said channel portions of said thin polysilicon layer have said second conductivity type.

18. The device of claim 13 wherein said channel portions of said thin polysilicon layer have said second conductivity type.

19. The device of claim 18 wherein said channel portions of said thin polysilicon layer have a thickness which is less than 2000 angstroms.

20. The device of claim 18 wherein said gate electrode comprises polysilicon doped with said first conductivity type, and wherein said thin polysilicon layer comprises a second conductivity type.

* * * * *